United States Patent [19]
Logan et al.

[11] Patent Number: 5,040,186
[45] Date of Patent: Aug. 13, 1991

[54] INP-BASED QUANTUM-WELL LASER

[75] Inventors: Ralph A. Logan, Morristown; Tawee Tanbun-Ek, Summit; Henryk Temkin, Berkeley Heights, all of N.J.

[73] Assignee: AT&T Bell Laboratories, Murray Hill, N.J.

[21] Appl. No.: 564,679

[22] Filed: Aug. 7, 1990

Related U.S. Application Data

[63] Continuation-in-part of Ser. No. 492,143, Mar. 13, 1990, abandoned.

[51] Int. Cl.⁵ .......................... H01S 3/19; H01S 3/30
[52] U.S. Cl. ........................................... 372/45; 372/6
[58] Field of Search ........................ 372/6, 45, 46, 43

[56]  References Cited

U.S. PATENT DOCUMENTS

| | | | |
|---|---|---|---|
| 4,787,089 | 11/1988 | Hayakawa et al. | 372/45 |
| 4,835,778 | 5/1989 | Kafka et al. | 372/6 |
| 4,860,297 | 8/1989 | Hayakawa et al. | 372/45 |
| 4,923,279 | 5/1990 | Ainslie et al. | 359/96.30 |
| 4,967,416 | 10/1990 | Esterowitz et al. | 372/6 |

OTHER PUBLICATIONS

"Theoretical Gain of Strained-Layer Semiconductor Lasers in the Large Strain Regime", by T. C. Chong et al., *IEEE Journal of Quantum Electronics*, vol. 25, No. 2, Feb. 1989, pp. 171-178.

"The Influence of Strain on the Small Signal Gain and Lasing Threshold of GaInAs/GaAs and GaAs/GaInAlAs Strained Layer Quantum Well Lasers", by G. Feak et al., *Proceedings, IEE Cornell Conference on Advanced Concepts in High Speed Semiconductor Devices and Circuits*, pp. 362-372, 1-1989.

"The Properties of Long Wavelength Strained Layer Superlattice Lasers Grown by MOVPE", by K. J. Monserrat et al., *Journal of Electronic Materials*, vol. 18(4), 2-1989, pp. 475-480.

"Optical and Microwave Performance of GaAs-AlGaAs and Strained Layer InGaAs-GaAs-AlGaAs Graded Index Separate Confinement Heterostructure Single Quantum Well Lasers", by S. D. Offsey et al., *IEEE Photonics Technology Letters*, vol. 2(1), Jan., 1990, pp. 9-11.

"High Quantum Efficiency, High Power, Modulation Doped GaInAs Strained-Layer Quantum Well Laser Diodes Emitting at 1.5 μm", by P. J. A. Thijs, *Electronics Letters*, Dec. 7, 1989, vol. 25(25), pp. 1734-1737.

"Long Wavelength Strained Layer Lasers", by A. Ghiti et al., *IEE Colloquium on Heterojunction and Quantum Well Devices*, pp. 3/1-3, (1988).

"Graded-Index Separate-Confinement InGaAs/GaAs Strained-Layer Quantum Well Laser Grown by Metalorganic Chemical Vapor Deposition", D. Keketa, K. T. Chan, J. M. Ballantyne, L. F. Eastman, Appl. Phys. Lett. 49 (24), 1659-1660, Dec. 1986.

"GRIN-SCH AlGaInAs/InP Quantum-Well Lasers Emitting at 1300 nm", R. M. Ash, D. J. Robbins, J. Thompson, *Electronics Letters*, vol. 25, No. 22, pp. 1530-1531, Oct. 1989.

"High Quantum Efficiency, High Output Power 1.3 μm GaInAsP Buried Graded-Index Separate-Confinement . . . ", A. Kasukawa, I. J. Murgatroyd, Y. Imajo, N. Matsumoto, T. Fukushima, H. Okamoto, S. Kashiwa, *Japanese J. of Appl. Phys.* vol. 28, No. 4, pp. L661-L663, Apr. 1989.

(List continued on next page.)

*Primary Examiner*—Georgia Epps
*Attorney, Agent, or Firm*—E. E. Pacher

[57] ABSTRACT

Disclosed is a graded index separate confinement heterostructure quantum well (GRIN-SCH QW) laser with continuously graded, substantially index matched InGaAsP confinement layer. The inventive device is well adapted for high power output in the wavelength region 1.2-1.68 μm. In particular, it can readily be designed to have an output wavelength that makes it suitable as pump source for Er-doped optical fiber amplifiers. A method of manufacturing a laser according to the invention is also disclosed.

10 Claims, 4 Drawing Sheets

"1.3 μm GaInAsP/InP Buried Heterostructure Graded Index Separate Confinement Multiple Quantum Well (BH-GRIN-SC-MQW) Lasers Entirely Grown...", A. Kasukawa, Y. Imajo, T. Makino, Electronics Letters, vol. 25, No. 2, pp. 104–105, Jan. 1989.

"1.5 μm GaInAs/GaInAsP Graded Index Separate Confinement Heterostructure Multiple Quantum Well (GRIN-SCH-MQW) Laser Diodes Grown by...", A. Kasukawa, I. J. Murgatroyd, Y. Imajo, T. Namegaya, H. Okamoto, S. Kashiwa, Electronics Letters, vol. 25, No. 10, pp. 660–661, May 1989.

"Critical Layer Thickness in Strained $Ga_{1-x}In_xAs$/InP Quantum Wells", H. Temkin, D. G. Gershoni, S. N. G. Chu, J. M. Vandenberg, R. A. Hamm, M. B. Panish, Appl. Phys. Lett., vol. 55, No. 16, pp. 1668–1670, Oct. 1989.

"Very Low Threshold InGaAs/InGaAsP Graded Index Separate Confinement Heterostructure Quantum Well Lasers Grown by Atmosphere Pressure Metal-Organic...", T. Tanbun-Ek, R. A. Logan, H. Temkin, K. Berthold, A. F. J. Levi, S. N. G. Chu, Appl. Phys. Lett. (55(22) pp. 2283–2285, Nov. 1989.

"Reproducible Growth of Low-Threshold Single and Multiple Quantum Well InGaAs/InP Lasers by a Novel Interlayer Growth Technique", T. Tanbun-Ek, H. Temkin, S. N. G. Chu, R. A. Logan, Appl. Phys. Lett. 55(9), pp. 819–821, Aug. 1989.

IN P-BASED QUANTUM-WELL LASER

This application is a continuation-in-part of application Ser. No. 492,143, filed on Mar. 13, 1990 now abandoned.

FIELD OF THE INVENTION

This invention pertains to the field of semiconductor lasers.

BACKGROUND OF THE INVENTION

As is well known, imperfections or defects (e.g., dislocations, point defects associated with local areas of non-stoichiometry or foreign inclusions) that are present in semiconductor lasers typically have the greatest effect on laser characteristics if the laser is operated at high power level. Among such possible effects are such highly deleterious ones as rapid deterioration of the laser, output power saturation caused by leakage paths, and inhomogeneity of the distribution of the output envelope of the radiation. Thus it is imperative that high power semiconductors lasers, including quantum well lasers, be free of imperfections and defects to the greatest degree possible.

Quantum well lasers are considered to have many advantages over conventional double heterostructure lasers. These advantages include improved high frequency response, narrower linewidths, higher output power, reduced chirp under modulation, lower threshold current densities, and increased temperature coefficient $T_o$. These advantages have been demonstrated in the GaAs/AlGaAs system.

An advantageous GaAs-based quantum well laser that comprises a graded index separate confinement heterostructure has been reported. See D. Feketa et al., *Applied Physics Letters*, Vol. 49(24), pages 1659-60. This reference discloses GaAs-based strained layer quantum well lasers, grown by MOCVD, wherein the 4 nm thick $Ga_{0.63}In_{0.37}As$ quantum well is situated between two 0.2 $\mu$m thick $Al_xGa_{1-x}As$ regions having continuously graded refractive index, wherein x varies continuously and linearly from 0 to 40%. The devices apparently have powers up to about 30 mW/facet, and emitted at a wavelength of about 1 $\mu$m.

As those skilled in the art know, the AlGaAs system has the property that essentially any composition within the system is lattice matched with any other composition within the system. Due to this special property of the AlGaAs system, it is relatively easy to produce a continuously graded index region of the type present in the Feketa et al. lasers.

R. M. Ash, et al., *Electronics Letters*, Vol. 25(22) pp. 1530-1531 (1988) disclose In P-based graded index separate confinement heterostructure quantum well (GRIN-SCH QW) lasers with continuously graded confinement layers of composition $Al_yGa_{0.48-y}In_{0.52}As$, with y varying linearly from 0.35 to 0.25. The GaAlInAs system resembles the AlGaAs system in that in the former the concentration in the growth atmosphere of only the group III species need to be varied. However, other quaternary semiconductor systems do not have this property. The InGaAsP is exemplary of these systems.

On the other hand, the InGaAsP system has pronounced advantages over the InGaAlAs system that would make it highly desirable to be able to use the former in GRIN-SCH QW lasers. In particular, the presence of Al, a strong oxygen getter, makes such highly sensitive and complex devices as GRIN-SCH QW lasers relatively difficult to manufacture, since it requires the vigorous elimination of all sources of oxygen in the growth chamber. Under manufacturing conditions this is a difficult task, as those skilled in the art well know, making GRIN-SCH QW lasers that do not comprise Al-containing semiconductor material preferable to such lasers that comprise such material.

Due at least in part to the above referred to complication in the InGaAsP system, it is generally believed by those skilled in the art that continuously graded index regions are not feasible in this system (and in other multiconstituent systems wherein the lattice constant depends on the composition).

In order to obtain emission wavelengths above about 1.2 $\mu$m in InGaAs-based QW lasers, the quantum wells would have to be very thin (e.g., about 2-3 nm). Such thin wells are difficult to make. Furthermore, laser performance might be hampered by the resulting difficulties in the carrier capture process. On the other hand, these relatively long wavelengths are of special interest for optical fiber communication. Of particular recent interest are wavelengths at or near about 1.3 $\mu$m or 1.5 $\mu$m. For instance, radiation at or near 1.48 $\mu$m can serve as pump radiation in a 1.55 $\mu$m optical fiber communication system that comprises an Er-doped fiber optical amplifier. To be suitable as a source of such pump radiation a laser should have relatively high output power, since the gain that can be obtained in a given fiber optical amplifier increases with increasing pump power. Exemplarily, such a laser should be capable of providing output power of at least 10 mW/facet, preferably more than 25 or even 50 mW/facet. A. Kasukawa et al., *Japanese Journal of Applied Physics*, Vol. 28(4), pp. L661-L663, *Electronics Letters*, Vol. 25(2), pp. 104-105, and *Electronics Letters*, Vol. 25(10), pp. 659-661 (all incorporated herein by reference) disclose 1.3 $\mu$m and 1.5 $\mu$m InP-based quantum well lasers that comprise two step-wise graded GaInAsP confinement layers. Although the lasers were reported to have been operated at quite high powers, the prior art devices contain features that potentially can result in defects, and thus could reduce yield and/or lead to decreased lifetime. In particular, the presence of step-wise composition changes in the confinement layers can lead to these and other deleterious results. This is due at least in part to the fact that step-wise compositional change requires the growth of separate layers, and during the pause between layers (when source compositions are changed) it is difficult to prevent defect formation at the interface.

In view of the potential importance of high power, long wavelength quantum well lasers for, e.g., optical amplification in appropriately doped fibers, it would be highly desirable to have available a quantum well laser that emits in the wavelength range above about 1.2 $\mu$m (e.g., at a wavelength that is suitable for pumping of a fiber optical amplifier), that can be readily manufactured and that can be operated at relatively high power levels. As was discussed above, high power operation requires that the laser be relatively free of imperfections and defects. Such a desirable laser therefore would comprise design features that tend to reduce the incidence of imperfections and defects. This application discloses such a laser.

DEFINITION AND GLOSSARY OF TERMS

By "CW emission" we mean herein emission that has relatively constant amplitude over periods of time that are sufficient to permit substantial establishment of thermal equilibrium of the laser.

The "critical thickness $x_c$" herein is that thickness of a given strained semiconductor layer above which strain-relieving dislocations generally appear. The critical thickness depends, inter alia, on the composition of the given layer as well as on the compositions of the adjoining layer or layers, and can be determined theoretically or experimentally. See, for instance, H. Temkin, et al., *Applied Physics Letters*, Vol. 55(16), pp. 1668–1670.

SUMMARY OF THE INVENTION

In a broad aspect the invention is apparatus that comprises a semiconductor quantum well laser having an emission wavelength in the range 1.2–1.68 μm and being capable of room temperature CW emission, wherein the laser comprises a confinement layer (typically two confinement layers, with one or more quantum wells between them), that comprises GaInAsP, with the composition of at least a significant portion of the material of the confinement layer varying continuously through the thickness of the portion, with the compositional variation adjusted such that the portion is substantially lattice matched. By "substantially lattice matched" we mean herein that $\Delta a/a \leq 3 \times 10^{-4}$, where a is the lattice constant of the material to which the confinement layer is lattice matched, and $\Delta a$ is the maximum deviation of the lattice constant in the "lattice matched" portion of the confinement layer from a. Typically, the composition of both confinement layers varies continuously, with the material of the confinement layer being single crystal InGaAsP.

Exemplarily, the confinement layer comprises a multiplicity of sublayers, with the composition of a given sublayer varying essentially linearly with distance from an appropriate interface. In currently preferred embodiments, the thickness is selected to be less than the critical thickness for defect formation. This however is an optional added precaution that may not be required in many cases.

Whereas the confinement layers in devices according to the invention are substantially lattice matched and thus are not intentionally strained, the quantum well (or wells) and, where applicable, the barrier layers between the wells, in these devices may, but need not be, strained. In fact, in some currently preferred embodiments the quantum well composition is such that the wells are strained, with the well thickness and composition selected such that the well thickness is below the critical thickness for the given lattice mismatch. Desirably, the composition of the barrier layers between the quantum wells is selected such that the strain in the former is the opposite of that in the latter (e.g., compressive vs. tensile), such that the overall strain in the region between the confinement layers is kept to a low value.

As is known, the band gap and optical properties of a quantum well can be varied by means of lattice strain. Thus, by appropriate choice of lattice mismatch the range of the well thickness-laser wavelength dependence can be extended to permit easy tailoring of the laser wavelength through choice of growth parameters.

As discussed above, a significant aspect of lasers according to the invention in the presence therin of a continuously graded, substantially lattice watched, In-GaAsP confinement layer. Even though this feature causes inventive lasers to be well adapted for high power operation, inventive lasers need not necessarily be high power (i.e., more than 10, 25, or even 50 mW output power) lasers. In some preferred embodiments the composition of the layers that make up the active region of the laser is chosen such that the quantum well (or wells) is strained in tension, with $\Delta c/c \geq 10^{-3}$, where c is the (room temperature, equilibrium) lattice constant of quantum well material grown with the same lattice constant as the substrate crystal (i.e., lattice matched to the substrate crystal), and $\Delta c = c - c_b$, where $c_b$ is the (room temperature, equilibrium) lattice constant of the quantum well material when grown with a deficit (or excess) of one or more constituent species relative to the lattice matched composition, such that the lattice constant is not matched to the substrate crystal. When $\Delta c$ is positive the quantum well lattice constant is smaller than that of the substrate crystal and the quantum well material is in tensile strain. Conversely, when $\Delta c$ is negative then the quantum well material is in compressive strain. Those skilled in the art will appreciate that the thickness of a strained quantum well has to be less than the critical thickness $x_c$.

We have made the unexpected discovery that InP-based lasers having quantum wells in tensile strain can have output power. (including cw power) that substantially exceeds that obtainable from analogous unstrained lasers, or from analogous lasers with compressively strained quantum wells. Although particularly preferred embodiments of the invention contain both continuously graded confinement layers and quantum wells in tensile strain, this is not necessarily the case. For instance, continuous grading can advantageously be used with essentially unstrained or compressively strained quantum wells, and quantum wells in tensile strain can be incorporated into lasers with step-wise graded confinement layers.

Apparatus according to the invention exemplarily is an optical fiber communication system that comprises a length of rare earth (e.g., Er)-doped optical fiber, a laser according to the invention that comprises means for causing an electrical current to flow through the laser such that the laser has output radiation in the wavelength range 1.2–1.68 (e.g., 1.48) μm, and means for coupling at least a part of the output radiation into the rare earth-doped fiber. The apparatus of course also comprises such conventional members as a source of signal radiation, means for coupling the signal radiation into an optical fiber link that comprises the length of rare earth-doped optical fiber, and means for detecting the signal radiation that was transmitted through the fiber link.

The laser according to the invention exemplarily is a quantum well laser with wells in tensile strain, and preferably comprises continuously graded confinement layers.

In a further aspect the invention is a method of making a laser of the type described above. The method comprises providing a III-V semiconductor body having a major surface, and exposing the major surface to an atmosphere that comprises a multiplicity of molecular species (comprising a first and a second species) such that a confinement layer is formed. The step of forming the confinement layer comprises changing, during at least a part of the formation time of the confinement layer, the concentration of the first species and second species. The respective rates of change are selected such that the composition of the resulting multiconstituent semiconductor material varies continuously with distance from an appropriate interface, e.g., the major surface, with the lattice constant of the resulting material being substantially constant.

DETAILED DESCRIPTION OF SOME PREFERRED EMBODIMENTS

Figure 1:
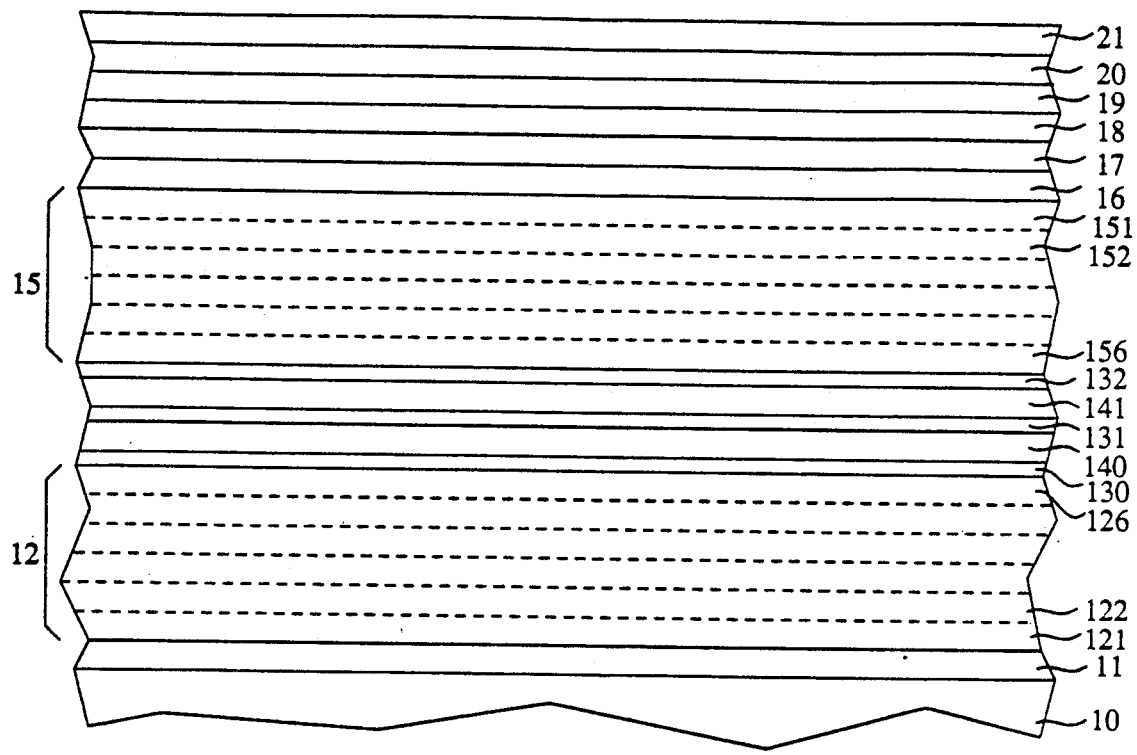
FIG. 1 schematically shows the layer sequence in an exemplary laser according to the invention.

FIG. 1 schematically shows the layer sequence in an exemplary preferred embodiment of the invention, namely, an InP-based strained layer quantum well laser. Substrate 10 is S-doped (n~$10^{18}$/cm$^3$) 100-oriented InP, as is 1 μm thick epitaxial layer 11. Lower confinement layer 12 consists of continuously graded InGaAsP and comprises 6 sublayers 121–126, each sublayer being about 40 nm thick. Sublayer 121 at the interface with 11 has a composition having a bandgap corresponding to $\lambda_g=0.99$ μm (compositions in this quaternary system are frequently identified by a corresponding bandgap wavelength. This notation is unambiguous and well understood by those skilled in the art), with its composition being linearly graded to result in composition corresponding to $\lambda_g=1.04$ μm at the interface with sublayer 122. The compositions of all other sublayers are similarly linearly graded, with the compositions at the other interfaces corresponding, respectively, to 1.12 μm, 1.16 μm, 1.206 μm and 1.25 μm (at the interface with quantum well 130). It is to be emphasized that at the interface between any two sublayers there is no change in composition but only a change in the rate of change of composition. In particular, there is a change in the rate of change of both Ga and As content with distance from, e.g., layer 11. Strained quantum wells 130, 131, and 132 each are 4.5 nm thick In$_{0.5}$Ga$_{0.5}$As, with 20 nm thick InGaAsP layers 140 and 141 (of composition corresponding to $\lambda_g=1.25$ μm) therebetween. Confinement layer 15 is the mirror image of 12, and is followed by 50 nm thick undoped (n~$10^{16}$/cm$^3$) InP layer 16, 0.2 μm thick Zn-doped (p~$4\times10^{17}$/cm$^3$) InP layer 17, 0.9 μm thick Zn-doped (p~$8\times10^{17}$/cm$^3$) InP layer 18, 0.4 μm thick Zn-doped (p~$1.1\times10^{18}$/cm$^3$) InP layer 19, 0.12 μm Zn-doped (p~$5\times10^{18}$/cm$^3$) InGaAsP (composition corresponding to $\lambda_g=1.2$ μm) layer 20, and by 0.06 μm thick Zn-doped (p~$10^{19}$/cm$^3$ InGaAsP (composition also corresponding to $\lambda_g=1.2$ μm) layer 21. As those skilled in the art will recognize, the above combination of confinement layers, quantum wells and barrier layers results in quantum wells that are in tensile strain, with Δc/c being greater than about $10^{-3}$.

The above-described epitaxial layer structure was grown by atmospheric pressure metal organic vapor phase epitaxy (MOVPE). However, other growth techniques (e.g., low pressure MOVPE, CBE or gas source MBE) can also be used to practive the invention.

The substrate 10 was prepared conventionally, and epitaxial layer 11 was grown thereon by a conventional technique. The growth of the confinement layers was performed at 625° C., with trimethyl indium (TMIn) at 30° C., trimethyl gallium (TMGa) at −15° C., 5% AsH$_3$ and 20% PH$_3$ as precursors. After dicing, provision of conventional optical coating, electrical contacts, and heat dissipation means the laser output was measured. Output in excess of 200 mW was observed in a laser of structure substantially as described.

Figure 2:
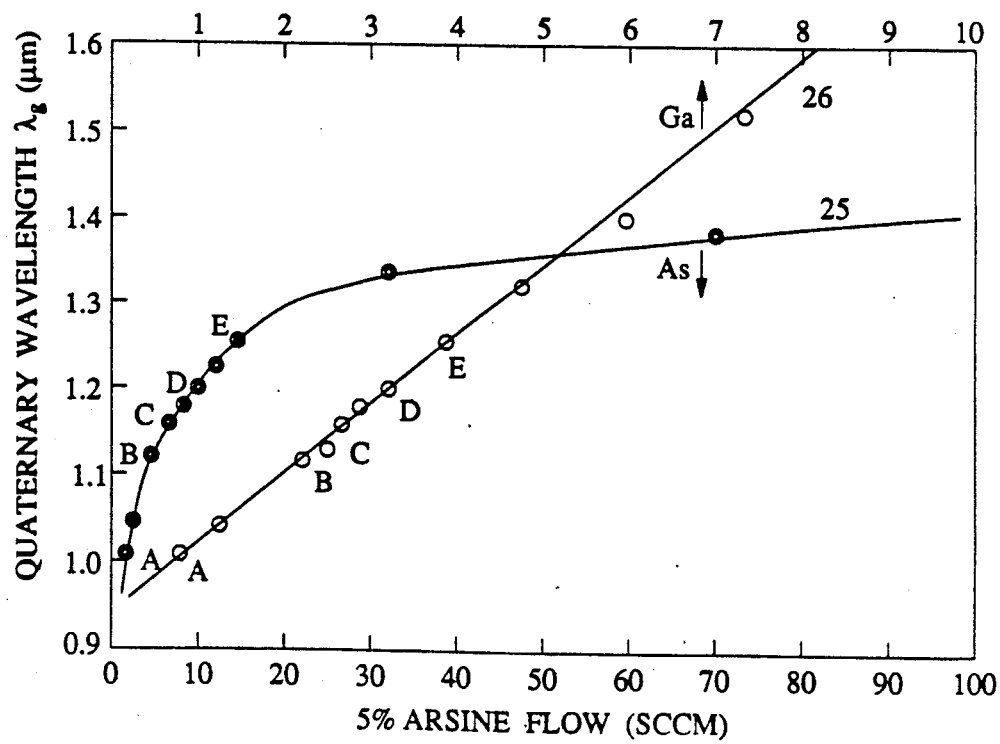
FIG. 2 shows exemplary data on gas precursor flow conditions for growth of InGaAsP that is lattice watched to InP.

FIG. 2 shows exemplary data on the precursor flow conditions necessary to grow InGaAsP layers that are lattice matched to InP, with $\lambda_g$ ranging from 0.9 to 1.40 μm. The data assumes that the flow of 70 sccm TMIn and 225 sccm of the 20% PH$_3$ is kept constant at a rate that results in excess In and P in the growth atmosphere. The figure indicates, for instance, that, in order to obtain material having a composition corresponding to $\lambda_g=1.01$ μm the TMGa and AsH$_3$ flow rates are to correspond to points A on curves 26 and 25, respectively. Analogous remarks apply to compositions corresponding to points B, C, D, and E, as well as to all other points on the curves, as those skilled in the art will recognize.

As discussed above, the devices according to the invention the composition of the confinement layer is varied continuously over a considerable range, e.g., from $\lambda_g=0.99$ μm to $\lambda_g=1.25$ μm. This could be done by controlling the flow rate of TMGa and AsH$_3$ so as always to lie on curves 26 and 25, respectively. This however would pose a complex control problem (since curve 25 is highly non-linear) and is typically not necessary. We have found that a piece-wise linear approximation gives perfectly acceptable results.

In order to grow a InGaAsP confinement layer of thickness t whose composition is lattice matched to InP and varies continuously between $\lambda_{g1}$ and $\lambda_{g2}$, the quantity $\Delta\lambda_g=\lambda_{g2}-\lambda_{g1}$ exemplarily is divided into n parts that define the compositions at which the rate of change of TMGa flow and of AsH$_3$ flow will be changed. Exemplarily, these correspond to points B, C, and D of FIG. 2.

By way of example, if the layer of material on which the InGaAsP confinement layer is to grow has composition $\lambda_{g1}$ and if n=6, then the following procedure can be used. By any appropriate means (e.g., using FIG. 2) the TMGa and AsH$_3$ flow rates corresponding to $\lambda_{g1}$, $\lambda_{g2}$, and to the 5 intermediate compositions at which the rate of change of the flow rates are to be altered are determined. Since the material growth rate at any given set of flow rates (at a given constant temperature) is known, the time required to grow any given sublayer can be readily determined. The sublayers will frequently be all the same thickness. By determining the difference in TMGa flow rate corresponding to $\lambda_{g1}$ and that corresponding to $\lambda_{g1}+\Delta\lambda_{ga}$ (the composition at which the rate of change of the flow rates is to be changed for the first time), and dividing the thus determined difference in flow rate by the previously determined time to grow the first sublayer, the appropriate rate of change of TMGa flow rate is determined. By an analogous procedure the appropriate rate of change of AsH$_3$ is determined. This procedure can be applied in analogous fashion to determine the appropriate rates of change of flow rates for all the other sublayers of the desired InGaAsP confinement layer.

Computer controllable mass flow controllers suitable for use with TMGa and AsH$_3$ are commercially available, and software to program a computer to change the flow rates in the above-described fashion is routine for those skilled in the art and does not require discussion.

Continuing with the discussion of the exemplary embodiment; after the layer of composition $\lambda_{g1}$ has reached the desired thickness, the flows of TMGa and AsH$_3$ are changed, without growth interruption, such that the flows vary at the respective, previously determined new rates. After elapse of the previously determined time, the rate of change of the respective flows are again adjusted without interruption of the growth. This procedure is continued until all the sublayers are completed.

Since the inventive procedure for growth of InGaAsP confinement layers requires only changes in the rate of change of gas flow, the growth of a confinement layer can be continuous, without cessation of growth upon completion of a given sublayer, as necessarily occurs in the growth of prior art step-wise graded InGaAsP confinement layers. This is considered to be a significant aspect of the invention, since defects tend to easily form from the ambient in the absence of growth.

Figure 3:
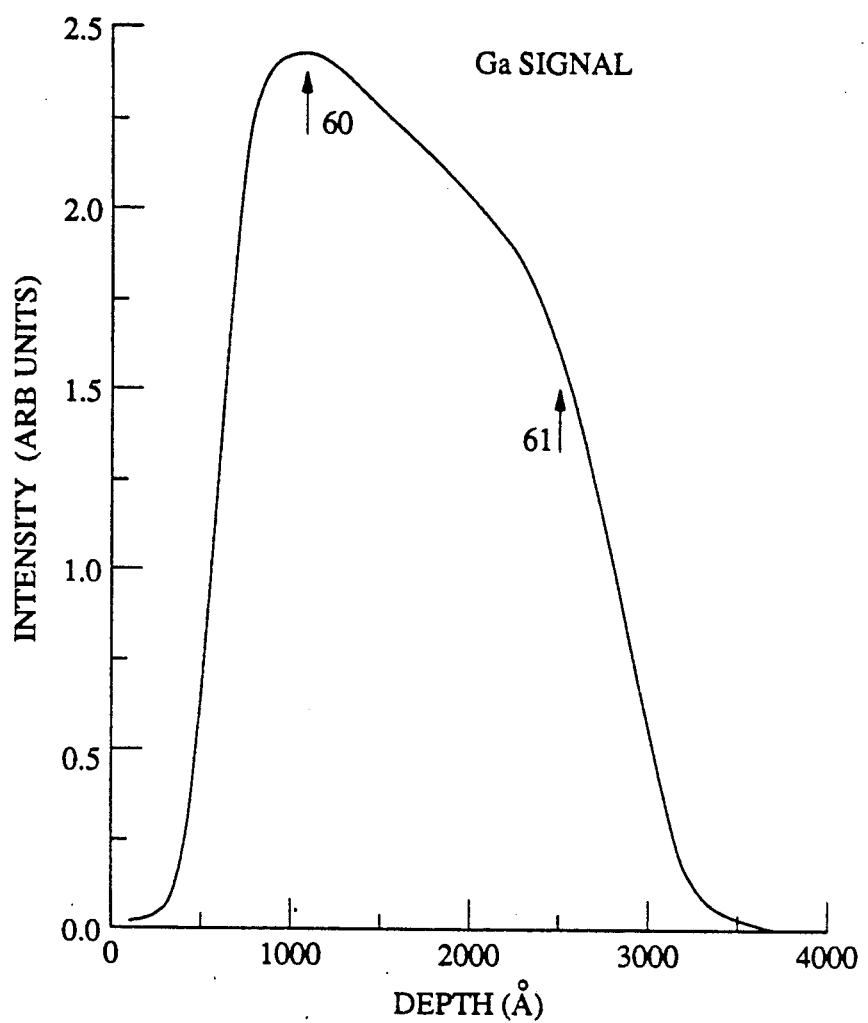
FIG. 3 gives data on the Ga content of an exemplary continuously graded InGaAsP layer.

FIG. 3 shows exemplary data on the Ga content of a In$_x$Ga$_{1-x}$As$_y$P$_{1-y}$ continuously graded confinement layer according to the invention, with y~2.2 x in the solid, and $\lambda_g$ varying from 1.1 μm at arrow 60 to 1.25 μm at arrow 61. As can be seen, the Ga concentration varies continuously (linearly over a major portion of the layer thickness), thereby reducing the likelihood of defect formation.

Figure 4:
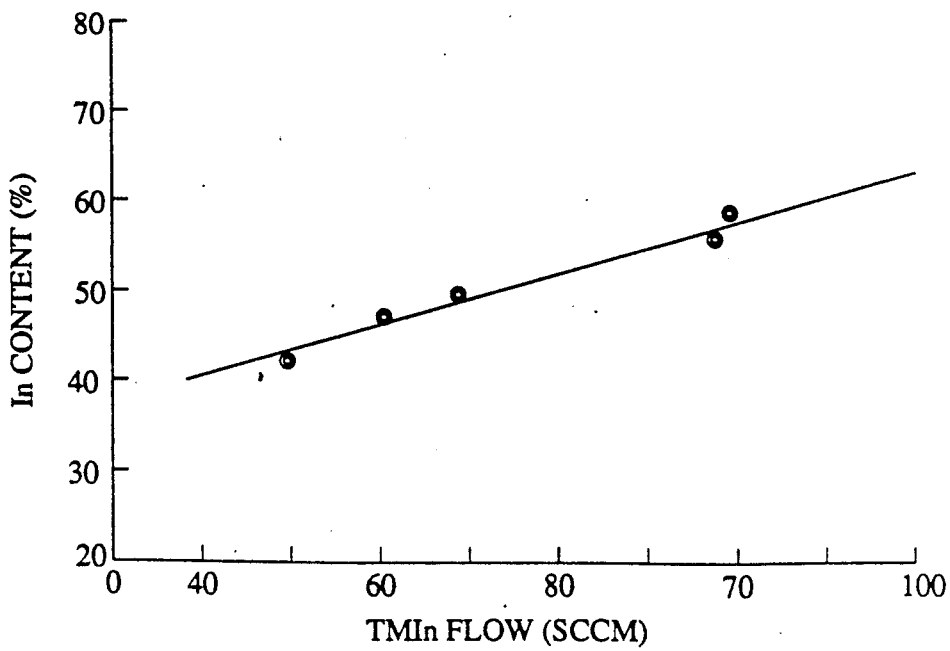
FIGS. 4 and 5 show exemplary data on, respectively, the In content of InGaAsP and the growth rate of InGaAsP; as a function of TMIn flow rate.

Upon completion of the growth of the lower confinement layer (e.g. 12 of FIG. 1) typically a quantum well is grown, preferably without (or with minimal) pause in the growth. The quantum well advantageously is In$_x$Ga$_{1-x}$As, with the value of x and the well thickness chosen to yield the desired lasing wavelength. FIG. 4 shows exemplary data on the In content of InGaAs as a function of TMIn flow rate. As can be seen, the dependence is linear, facilitating straightforward adjustment of the solid composition.

Figure 5:
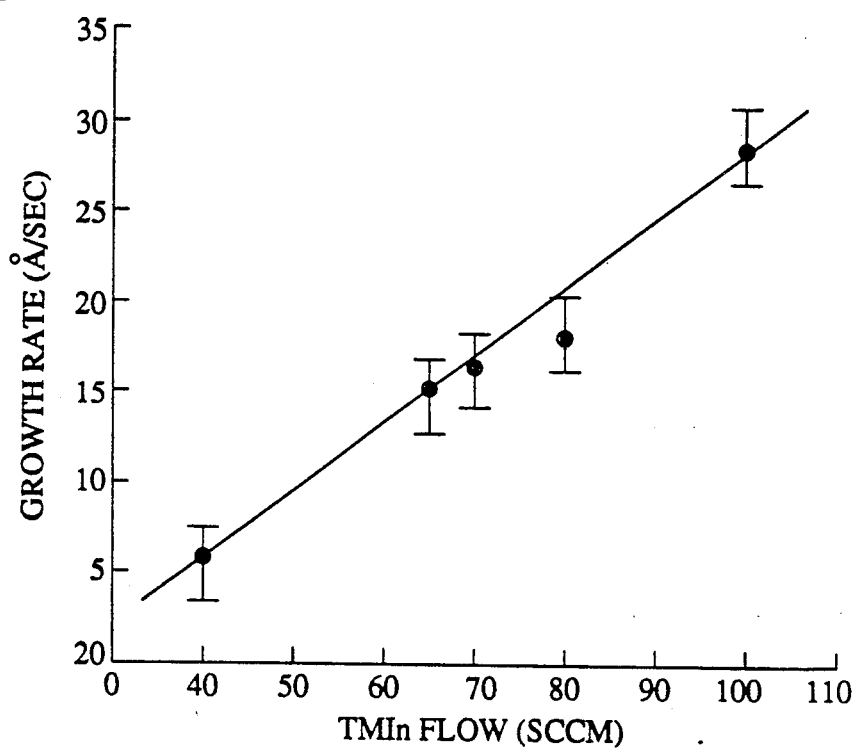

FIG. 5 shows exemplary data on the growth rate of InGaAs as a function of TMIn flow rate (with TMGa and AsH$_3$ flow fixed at 9 and 160 sccm, respectively). The dependence is linear, with the growth rate under the exemplary conditions depending only on the TMIn flow rate.

Figure 6:
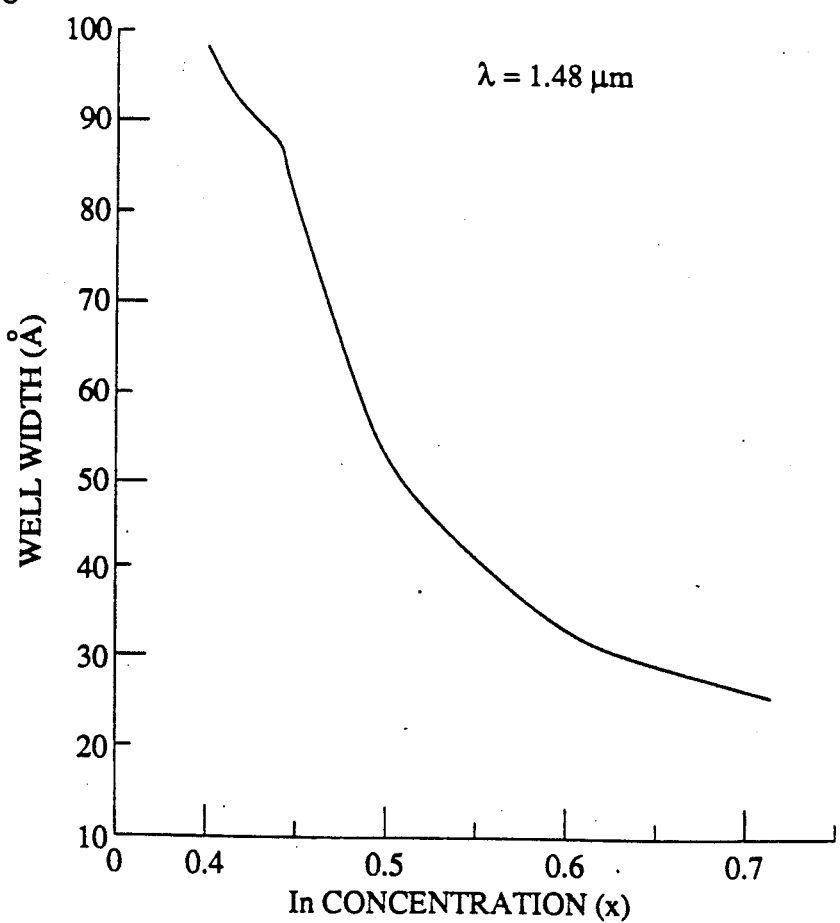
FIG. 6 gives an exemplary theoretical curve on the relationship between quantum well composition and width required to achieve a particular laser wavelength.

For at least some applications of lasers according to the invention (e.g., for use as a pumping source of a Er-doped fiber amplifier) it is necessary to finely tune the laser wavelength. This is made possible through adjustment of a degree of strain in the quantum well or wells. FIG. 6 shows an exemplary theoretical curve on the relationship between x (in In$_x$Ga$_{1-x}$As) and the well width needed in order to obtain a lasing wavelength of 1.48 μm. Experimental data we have obtained are in good agreement with the theoretical curve, at least for x ≧ 0.43. For x = 0.53 the composition is lattice matched with InP.

Figure 7:
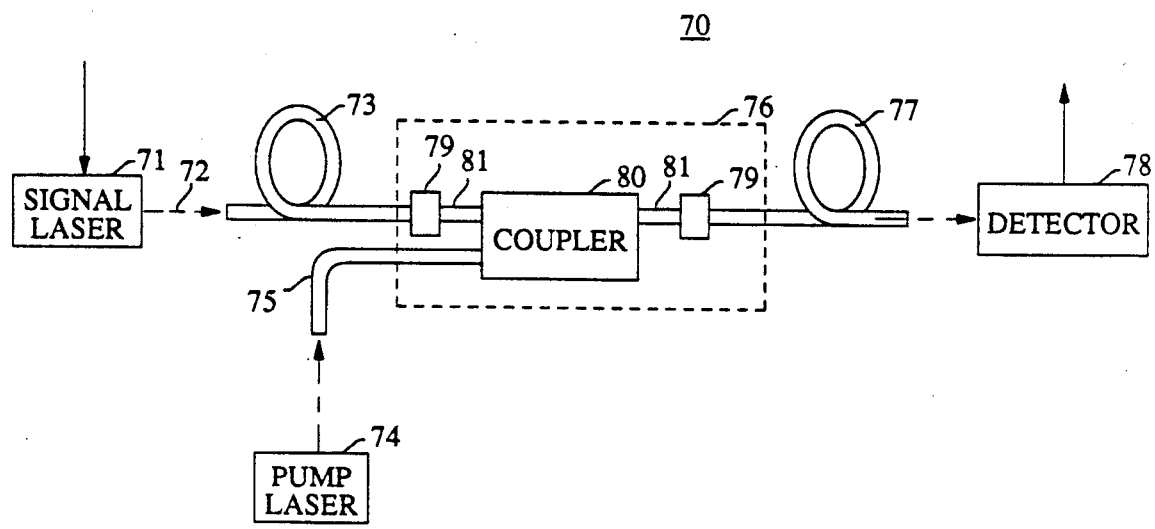
FIG. 7 schematically depicts exemplary apparatus according to the invention.

FIG. 7 schematically depicts exemplary apparatus according to the invention, namely, optical fiber communication system 70. Signal laser 71 emits signal radiation 72 which is coupled into standard transmission fiber 73 and transmitted therethrough to fiber amplifier 76.

Pump laser 74 emits pump radiation of an appropriate wavelength (e.g., 1.48 μm) which is transmitted by means of a short length of fiber 75 into 76. The latter comprises a rare-earth doped fiber 81 coupled signal-transmissively, by means of conventional connectors 79, to 73 and to transmission fiber 77. The amplifier 76 also comprises means 80 to couple the pump radiation from 75 to 81. Such means can be conventional. Signal radiation is amplified in 76 in known manner, and is then transmitted through 77 to detector 78.

We claim:

1. Apparatus comprising a semiconductor laser having an emission wavelength in the range 1.2–1.68 μm and being capable of room temperature CW emission, the laser comprising;
   (a) a confinement layer comprising GaInAsP; and
   (b) an active region comprising one or more quantum wells; wherein
   (c) the composition of at least a major portion of the material of the confinement layer varies continuously as a function of distance from the active region, with the variation selected such that at least the portion of the confinement layer is substantially lattice matched to InP.

2. Apparatus of claim 1, wherein the material of at least one quantum well is strained.

3. Apparatus of claim 2, wherein the active region comprises at least two quantum wells with a barrier layer therebetween, wherein the material of the at least two quantum wells is strained, the quantum well strain having a first sense, and wherein furthermore the material of the barrier layer is strained, the barrier layer strain being of a sense opposite to the first sense, whereby the overall strain of the active region is maintained at a relatively low level.

4. Apparatus of claim 1, wherein the laser is capable of CW emission at room temperature of at least 50 mW of optical power.

5. Apparatus of claim 1, wherein the confinement layer comprises a first and a contiguous second sublayer, with the composition of the material in the first sublayer varying at a first rate, and the composition of the second sublayer varying at a second rate that differs from the first rate.

6. Apparatus of claim 1, wherein the apparatus is an optical fiber communication system that comprises (i) a length of rare earth-doped optical fiber; (ii) means for causing an electrical current to flow through the laser such that the laser has an output radiation, the output radiation having a wavelength in the range 1.2–1.68 μm; and (iii) means for coupling at least a portion of the output radiation into the rare earth-doped optical fiber.

7. Apparatus of claim 6, wherein the rare earth-doped fiber comprises Er.

8. Apparatus of claim 2, wherein the material of the at least one quantum well is strained in tension.

9. An optical fiber communication system that comprises
   (i) a length of rare earth-doped optical fiber;
   (ii) an InP-based quantum well laser having an emission wavelength in the range 1.2–1.68 μm;
   (iii) means for causing an electrical current to flow through the laser such that the laser has a cw output radiation; and
   (iv) means for coupling at least a portion of the output radiation into the rare earth-doped optical fiber; wherein the laser is such that the material of at least one quantum well is under tensile strain such that $\Delta c/c \geq 10^{-3}$, where c is the room temperature equilibrium lattice constant associated with comparison quantum well well material that is lattice matched to InP, and $\Delta c = c - c_b$, where $c_b$ is the room temperature equilibrium lattice constant associated with the quantum well material.

10. System of claim 9, wherein the laser comprises at least one confinement layer in contact with the quantum well, with the composition of at least a major portion of the confinement layer varying continuously as a function of distance from the quantum well.

* * * * *